(12) United States Patent
Siddiqui et al.

(10) Patent No.: US 7,351,662 B2
(45) Date of Patent: Apr. 1, 2008

(54) COMPOSITION AND ASSOCIATED METHOD FOR CATALYZING REMOVAL RATES OF DIELECTRIC FILMS DURING CHEMICAL MECHANICAL PLANARIZATION

(75) Inventors: Junaid Ahmed Siddiqui, Richmond, VA (US); Daniel Hernandez Castillo, II, Laveen, AZ (US); Robin Edward Richards, Phoenix, AZ (US); Timothy Frederick Compton, Casa Grande, AZ (US)

(73) Assignee: DuPont Air Products Nanomaterials LLC, Tempe, AZ (US)

(*) Notice: Subject to any disclaimer, the term of this patent is extended or adjusted under 35 U.S.C. 154(b) by 10 days.

(21) Appl. No.: 11/233,110

(22) Filed: Sep. 22, 2005

(65) Prior Publication Data

US 2006/0162261 A1    Jul. 27, 2006

Related U.S. Application Data

(60) Provisional application No. 60/642,225, filed on Jan. 7, 2005.

(51) Int. Cl.
*H01L 21/302* (2006.01)

(52) U.S. Cl. .................. 438/690; 438/691; 438/692; 252/79.5

(58) Field of Classification Search .............. 438/691, 438/692, 690; 252/79.5; 451/37
See application file for complete search history.

(56) References Cited

U.S. PATENT DOCUMENTS

| | | | |
|---|---|---|---|
| 3,869,323 A | 3/1975 | Basi | |
| 6,290,580 B1 | 9/2001 | Tanaka et al. | |
| 6,300,249 B1* | 10/2001 | Yoshida et al. | 438/693 |
| 6,312,487 B1 | 11/2001 | Tanaka | |
| 6,350,393 B2 | 2/2002 | Francis et al. | |
| 6,358,853 B2 | 3/2002 | Cadien et al. | |
| 6,524,167 B1 | 2/2003 | Tsai et al. | |
| 6,626,967 B2 | 9/2003 | Takami et al. | |
| 2001/0003672 A1 | 6/2001 | Inoue et al. | |
| 2002/0032987 A1* | 3/2002 | Steckenrider et al. | 51/309 |
| 2002/0151252 A1* | 10/2002 | Kawase et al. | 451/36 |
| 2003/0115806 A1* | 6/2003 | Takami et al. | 51/308 |
| 2003/0119324 A1 | 6/2003 | Jung et al. | |
| 2003/0143848 A1* | 7/2003 | Steckenrider et al. | 438/689 |
| 2004/0098924 A1* | 5/2004 | Iwasa | 51/302 |
| 2006/0075687 A1* | 4/2006 | Tsuruta et al. | 51/307 |

FOREIGN PATENT DOCUMENTS

WO    WO 00/00560    1/2000

OTHER PUBLICATIONS

"Potassium bicarbonate", http://en.wikipedia.org/wiki/Potassium_bicarbonate Wikipedia, the free encyclopedia; pp. 1-2; 2006.*

OTHER PUBLICATIONS

Ammonium bicarbonate, http://en.wikipedia.org/wiki/Ammonium_bicarbonate Wikipedia, the free encyclopdia; pp. 1-2; 2006.*

G.B. Shin,et al, "Chemical-Mechanical Polish," Handbook of Semiconductor Manufacturing Technology, Chapter 15, Nishi, Doering, NYC, 2000, pp. 415-460.

* cited by examiner

*Primary Examiner*—Binh X. Tran
(74) *Attorney, Agent, or Firm*—Geoffrey L. Chase

(57) ABSTRACT

A low solids-content slurry for polishing (e.g., chemical mechanical planarization) of substrates comprising a dielectric and an associated method using the slurry are described. The slurry and associated method afford high removal rates of dielectric during polishing even though the slurry has low solids-content. The slurry comprises a bicarbonate salt, which acts as a catalyst for increasing removal rates of dielectric films during polishing of these substrates.

23 Claims, 2 Drawing Sheets

Effect of pH on the Oxide Removal rate (RR) using Ascend containing 0.6 Weight Percent Potassium Bicarbonate Effect of Percent Solids of Ascend Diluted Samples on the removal Rate of Oxide Using 0.6 Weight Percent Potassium Bicarbonate Effect of Weight Percent Silica of Diluted Ascend Samples on the PETEOS REmoval Rate (RR)

Percent Increase in oxide Removal rate as a Function of Percent Solid for Diluted Ascend Samples Containing 0.6% Potassium bicarbonate

COMPOSITION AND ASSOCIATED METHOD FOR CATALYZING REMOVAL RATES OF DIELECTRIC FILMS DURING CHEMICAL MECHANICAL PLANARIZATION

CROSS REFERENCE TO RELATED APPLICATIONS

The present application is a continuation-in-part of U.S. Provisional Patent Application Ser. No. 60/642,225 filed Jan. 07, 2005.

BACKGROUND OF THE INVENTION

The present invention pertains to low solids-content slurries for polishing (e.g., chemical mechanical polishing) a substrate comprising a dielectric material and which afford high removal rates while simultaneously affording low defectivities. It also pertains to an associated polishing method using the low solids-content slurries.

Chemical mechanical planarization (chemical mechanical polishing, CMP) is now widely known to those skilled in the art and has been described in numerous patents and open literature publications. An introductory reference on CMP is "Chemical-Mechanical Polish" by G. B. Shinn et al., Chapter 15, pages 415-460, in *Handbook of Semiconductor Manufacturing Technology*, editors: Y. Nishi and R. Doering, Marcel Dekker, New York City (2000).

In a typical CMP process, a substrate (e.g., a wafer) is placed in contact with a rotating polishing pad attached to a platen. A CMP slurry, typically an abrasive and chemically reactive mixture, is supplied to the pad during CMP processing of the substrate. During the CMP process, the pad (fixed to the platen) and substrate are rotated while a wafer carrier system or polishing head applies pressure (downward force) against the substrate. The slurry accomplishes the planarization (polishing) process by chemically and mechanically interacting with the substrate film being planarized due to the effect of the rotational movement of the pad relative to the substrate. Polishing is continued in this manner until the desired film on the substrate is removed with the usual objective being to effectively planarize the substrate (both metallic and dielectric portions).

In oxide CMP, a slurry is used to planarize films comprised of oxide dielectric material (e.g., silicon dioxide). In shallow trench isolation (STI) CMP, a slurry is used to planarize structures comprised of oxide dielectric material and silicon nitride. Furthermore, it is desired that the oxide CMP and STI CMP slurry compositions and associated methods afford planarized substrates characterized to have low defectivity levels, low haze levels, and low levels of scratching.

During the fabrication of integrated circuit chips, a polishing slurry comprising an abrasive (e.g., a colloidal silica) is utilized to achieve planarization of oxide dielectric layers in case of oxide CMP and metal layers in case of metal CMP. In case of the abrasive being colloidal silica, for example, for high volume manufacturing, chemical mechanical planarization (CMP) of oxide requires 26-32 weight percent of colloidal silica dispersions in order to achieve target removal rates. Using 26-32 weight percent colloidal silica dispersions, the oxide removal rate is typically between 3200 Å/min to 4200 Å/min, which is a standard electronics industry target for oxide CMP. There is a significant need to achieve high oxide removal rates using low-solids contents abrasive dispersions, since this approach can reduce waste handling costs as well as reduce production costs. The present invention provides a solution to this significant need.

BRIEF SUMMARY OF THE INVENTION

In one embodiment, the invention is a low solids-content composition for dielectric polishing comprising:
  a) an abrasive; and
  b) a bicarbonate salt as a catalyst for increasing removal rates of dielectric films;
  wherein the low solids-content composition exhibits a higher removal rate than a second composition, said second composition being identical to the low solids-content composition except that the bicarbonate salt is absent.

In another embodiment, the invention is a method of polishing a substrate comprising an dielectric with high removal rate of the dielectric, said method comprising the steps of:
  A) placing the substrate comprising the dielectric in contact with a polishing pad;
  B) delivering a low solids-content composition comprising:
    a) an abrasive; and
    b) a bicarbonate salt;
  wherein the low solids-content composition exhibits a higher removal rate than a second composition, said second composition being identical to the low solids-content composition except that the bicarbonate salt is absent; and
  C) polishing the substrate with the low solids-content composition.

DETAILED DESCRIPTION OF THE INVENTION

Composition

Figure 1:
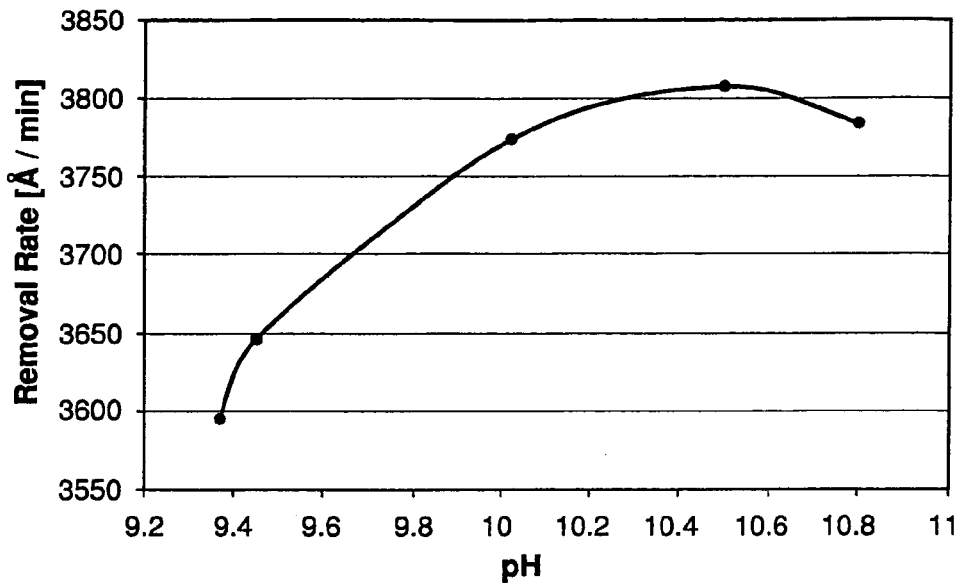
FIG. 1 is a graph showing the effect of pH on the PETEOS removal rate during CMP using a colloidal silica containing 0.6 weight percent of potassium bicarbonate.

The compositions of this invention comprise an abrasive and a bicarbonate salt and, when used in CMP processing or other polishing, these compositions are characterized to simultaneously afford relatively high removal rates and relatively low defectivity levels in polished samples.

Examples of bicarbonate salts suitable for this invention include, but are not limited to, alkali metal bicarbonates (e.g., potassium bicarbonate) and ammonium bicarbonate. In one embodiment, the bicarbonate salt is selected from the group consisting of potassium bicarbonate and ammonium bicarbonate. In another embodiment, the bicarbonate salt is potassium bicarbonate.

The levels of bicarbonate salt(s) vary in different embodiments according to the invention. In one embodiment, the bicarbonate salt(s) is present at a level of at least 0.1 weight percent. In other embodiments, the bicarbonate salt(s) is present at a level of at least 0.2 weight percent, at a level of at least 0.3 weight percent, at a level of at least 0.4 weight percent, at a level of at least 0.5 weight percent, at a level of at least 0.6 weight percent, at a level of at least 0.7 weight percent, at a level of at least 0.8 weight percent, at a level of at least 0.9 weight percent, at a level of at least 1.0 weight percent, at a level of at least 1.3 weight percent, and at a level of at least 1.6 weight percent.

Examples of abrasives suitable for this invention include, but are not limited to, colloidal silica, fumed silica, alumina and titania. In an embodiment, the abrasive is silica, which can be fumed silica, colloidal silica, or another silica type. In another embodiment, the silica is colloidal silica. In an embodiment that is more specific, the abrasive is colloidal silica and the colloidal silica comprises a hydroxide base and has a pH of at least 9. The hydroxide base is not limited but in one embodiment is either potassium hydroxide or ammonium hydroxide.

In one embodiment of the low-solids content compositions or slurries of this invention, the abrasive(s) is present at a level of less than or equal to 20 weight percent. In other embodiments, the abrasive(s) is present at a level of less than or equal to 17.5 weight percent, at a level of less than or equal to 15 weight percent, at a level of less than or equal to 12.5 weight percent, at a level of less than or equal to 10 weight percent, at a level of less than or equal to 7.5 weight percent, at a level of less than or equal to 5 weight percent, at a level of less than or equal to 4 weight percent, at a level of less than or equal to 3 weight percent, at a level of less than or equal to 2 weight percent, and at a level of less than or equal to 1 weight percent.

In an embodiment according to the invention, the composition comprises a) an abrasive; b) a bicarbonate salt, and further comprises c) a viscosity modifier. Examples of suitable viscosity modifiers according to the invention include, but are not limited to, a gum, which can be naturally occurring or synthetic. In one specific embodiment, the gum is Xanthan gum. The level(s) of gum(s) is non-limiting when present. In some embodiments, the level(s) of gum ranges from about 0.1 weight percent to about 3 weight percent.

Associated Method

In some embodiments the invention is methods of polishing a substrate using polishing compositions comprising a) an abrasive; and b) a bicarbonate salt as a catalyst for increasing removal rates of dielectric films. In one specific embodiment, the method of polishing is chemical mechanical planarization. In one more specific embodiment, the substrate comprises an oxide dielectric layer and the method of polishing is oxide chemical mechanical planarization.

The identities, levels, and characteristics of components (e.g., abrasive, bicarbonate salt, viscosity modifier) present in the polishing composition used in the methods according to the invention are the same as presented supra.

The associated methods of this invention entail use of the aforementioned composition (as disclosed supra) for polishing (e.g., chemical mechanical planarization) of substrates comprised of dielectric materials. In the methods, a substrate (e.g., a wafer) is placed face-down on a polishing pad which is fixedly attached to a rotatable platen of a CMP polisher. In this manner, the substrate to be polished and planarized is placed in direct contact with the polishing pad. A wafer carrier system or polishing head is used to hold the substrate in place and to apply a downward pressure against the backside of the substrate during CMP processing while the platen and the substrate are rotated. The polishing composition (slurry) is applied (usually continuously) on the pad during CMP processing to effect the removal of material to planarize the substrate.

Substrates

The composition and associated method of this invention are effective for CMP of a wide variety of substrates, including substrates having dielectric portions that comprise materials having dielectric constants less than 3.3 (low-k materials). Suitable low-k films in substrates include, but are not limited to, organic polymers, carbon-doped oxides, fluorinated silicon glass (FSG), inorganic porous oxide-like materials, and hybrid organic-inorganic materials. Representative low-k materials and deposition methods for these materials are summarized below.

| Vendor | Trade Name | Deposition Method | Material |
|---|---|---|---|
| Air Products and Chemicals | MesoElk ® | Spin-on | Hybrid organic-inorganic |
| Applied Materials | Black Diamond | CVD | Carbon-doped oxide |
| Dow Chemical | SiLK ™, Porous SiLK ™ | Spin-on | Organic polymer |
| Honeywell Electronic Materials | NANOGLASS ® E | Spin-on | Inorganic oxide-like |
| Novellus Systems | CORAL ® | PECVD | Carbon-doped oxide |

PECVD = Plasma enhanced chemical vapor deposition
CVD = chemical vapor deposition Glossary General Å: angstrom(s)—a unit of length CMP: chemical mechanical planarization=chemical mechanical polishing IC1010: polishing pad used during chemical mechanical planarization, supplied by Rohm and Haas Electronic Materials, Phoenix, Ariz.

Low solids-content composition or slurry: A composition or slurry of this invention that has level(s) of abrasive(s) less than or equal to 20 weight percent or alternatively any one of the other upper limits for abrasive(s) level(s) of other embodiments as defined supra.

min: minute(s)

ml: milliliter(s)

PETEOS: plasma enhanced chemical vapor deposition (CVD) of tetraethoxy silane, dielectric oxide layer.

psi: pounds per square inch

RR: removal rate(s) in Å/min (unless otherwise indicated)

Chemical Components

Ascend® OX-102: colloidal silica. Manufactured by DuPont Air Products NanoMaterials L.L.C., Tempe, Ariz., 85282.

Potassium bicarbonate: supplied by Sigma-Aldrich, P.O. Box 355, Milwaukee, Wis. 53201.

Potassium iodide: supplied by Sigma-Aldrich, P.O. Box 355, Milwaukee, Wis., 53201.

Plurafac® S505LF: A linear polyoxyalkylene ether of C6-C10 alcohol, molecular weight 1550 Daltons, manufactured by BASF, 3000 Continental Drive North, Mount Olive, N.J., 07828.

Xanthan gum: supplied by Sigma-Aldrich, P.O. Box 355, Milwaukee, Wis., 53201

EXAMPLES

Chemical Mechanical Planarization (CMP) Methodology

In the examples presented below, chemical mechanical planarization (CMP) experiments were run using the procedures and experimental conditions as given below.

Wafers

Polishing experiments were conducted using PETEOS (plasma enhanced tetraethoxysilane) 200 mm wafers, silicon nitride 200 mm wafers, Coral® 200 mm wafers, Black Diamond® 200 mm wafers, BPSG 200 mm wafers, and silicon carbide 200 mm wafers.

The PETEOS wafers were purchased from Advantiv Technologies™, Inc., 111 N. Market St., Suite 600 San Jose, Calif. 95113. The PETEOS film thickness specification for these wafers is 15,000 Å. Silicon nitride blanket wafers were purchased from Silicon Valley Microelectronics, Inc., 1150 Campbell Ave., San Jose, Calif. 95126. The silicon nitride film thickness specification for these wafers is 3,000 Å. Coral® blanket wafers were purchased from Silicon Valley Microelectronics, Inc., 1150 Campbell Ave., San Jose, Calif. 95126. The Coral® film thickness specification for these wafers is 10,000 Å. Black Diamond® blanket wafers were purchased from Silicon Valley Microelectronics, Inc., 1150 Campbell Ave., San Jose, Calif. 95126. The Black Diamond® film thickness specification for these wafers is 5,000 Å. BPSG blanket wafers were purchased from Silicon Valley Microelectronics, Inc., 1150 Campbell Ave., San Jose, Calif. 95126. The BPSG film thickness specification for these wafers is 10,000 Å. Silicon carbide blanket wafers were purchased from Silicon Valley Microelectronics, Inc., 1150 Campbell Ave., San Jose, Calif. 95126. The silicon carbide film thickness specification for these wafers is 10,000 Å.

Metrology

PETEOS, silicon nitride, Coral®, Black Diamond®, BPSG, and silicon carbide, thickness was measured with a Nanometrics instrument, model NanoSpece® 9200, Advanced Film Analysis System, manufactured by Nanometrics Inc, 1550 Buckeye Drive, Milpitas, Calif. 95035. Twenty-five and forty nine-point polar scans were taken at 5-mm edge exclusion. For example, from the polar scan data, PETEOS thickness was calculated using the difference between the average starting PETEOS thickness and average post-polish PETEOS thickness. A similar method was used to calculate the difference between the average starting thickness and average post-polish thickness for the silicon nitride, Coral®, Black Diamond®, BPSG, and silicon carbide wafers.

Particle Sizing Determinations

All particle size and number measurements were made using a Particle Sizing Systems (PSS) AccuSizer 780A instrument (PSS, Santa Barbara, Calif.). With use of an optical sensor, this instrument measures diameters of individual particles (assumed to be spherical in shape) using light scattering method. A given sample is automatically diluted until the sensor "sees" one particle at a time within the sample.

Polisher

The CMP tool that was used is a Mirra® CMP System, manufactured by Applied Materials, 3050 Bowers Avenue, P.O. Box 58039, Santa Clara, Calif., 95054. A IC-1010™ pad was used on platen 1. The IC-1010™ pad was supplied by Rohm and Haas Electronic Materials, 3804 East Watkins Street, Phoenix, Ariz., 85034, and were used for the blanket wafer polishing studies. Pads were broken-in by polishing ten-to-fifteen dummy oxide PETEOS wafers. In order to qualify the tool settings and the pad break-in, two PETEOS monitors were polished with Ascend® OX-102, colloidal silica, supplied by DuPont Air Products NanoMaterials L.L.C., at baseline conditions. The pad conditioner was a Saesol pad conditioning disk, diamond 4 inches with 80 grit at 6 pounds of down-force, supplied by Vias International, 8200 Cameron Road, Suite 162, Austin, Tex., 78754. The wafer polishing conditions using Mirra® tool were as follows:

Platen speed=93 RPM
Head speed=87 RPM
Inner tube pressure=5.0 psi
Retaining ring pressure=7.2 psi
Membrane pressure=5.0 psi
Slurry flow rate=175 m/min
Polish time=60 seconds
Conditioning disk down-force/rotation=6 lbs/95 rpm
Heads: standard Titan®
Retaining rings: AEP grooved
Conditioning Discs: Saesol

Example 1-6

These examples illustrate the effect of diluting colloidal silica and addition of 0.6% potassium bicarbonate to the diluted slurries on the PETEOS removal rate performance during wafer polishing.

Examples 1, 3, and 5

Comparative, no Potassium Bicarbonate Added to Colloidal Silica Dispersion

In the Comparative Examples, 1, 3, and 5,commercially available colloidal silica (Ascend® OX-102, DuPont Air Products NanoMaterials L.L.C., Tempe, Ariz.) was used as the polishing slurry at various levels of dilution with deionized water, but without addition of chemical accelerators (additives). The colloidal silica in Example 1 is a 20 weight percent dispersion, in Example 3, colloidal silica is 30 weight percent, and in Example 5 colloidal silica is 15 weight percent dispersion. The colloidal silica has a particle size of 50-60 nanometers. This colloidal silica was diluted with water for CMP processing in examples 1, 3, and 5 without the addition of potassium bicarbonate.

Examples 2, 4, and 6

In Examples, 2, 4, and 6, commercially available colloidal silica (Ascend® OX-K, DuPont Air Products NanoMaterials L.L.C., Tempe, Ariz.) as described in above Examples 1, 3, and 5, was used for polishing experiments at various levels of dilution with deionized water, after the addition of 0.6 weight percent potassium bicarbonate as a chemical accelerator (additive). The colloidal silica in Example 2 is a 20 weight percent dispersion with 0.6 weight percent potassium bicarbonate. In Example 4, colloidal silica is 30 weight percent with 0.6 weight percent potassium bicarbonate. In Example 6 colloidal silica is a 15 weight percent dispersion with 0.6 weight percent potassium bicarbonate. The colloidal silica has a particle size of 50-60 nanometers. These formulations based on Ascend® OX-102 were used for polishing experiments.

Discussion of Examples 1-6

Key results for Examples 1-6 are summarized in Table 1, which includes PETEOS removal rate data for PETEOS wafers CMP processed with the six slurries. As the data in this table indicate, as colloidal silica concentration (weight percent silica) decreased from 30 weight percent solids to 15 weight percent solids, PETEOS removal rate dropped from 4342 Å/min to 1963 Å/min.

Figure 2:
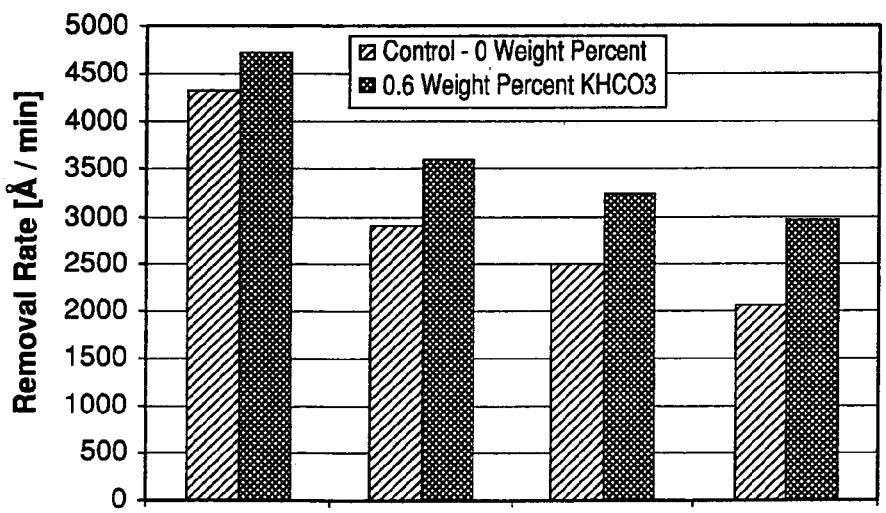
FIG. 2 and FIG. 3 are graphs showing the effects of potassium bicarbonate presence and percent solids of a colloidal silica upon removal rate during CMP.
Figure 3:
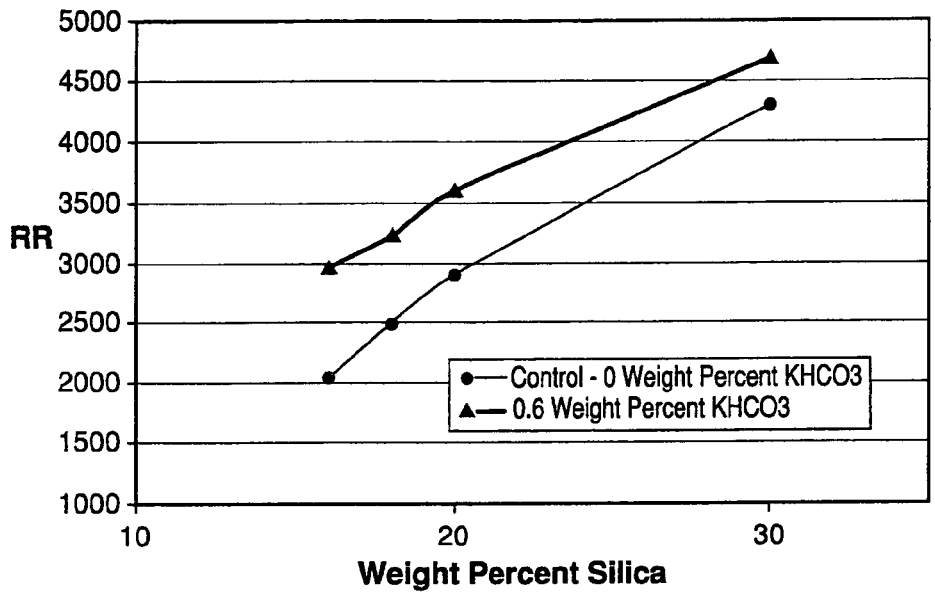
Figure 4:
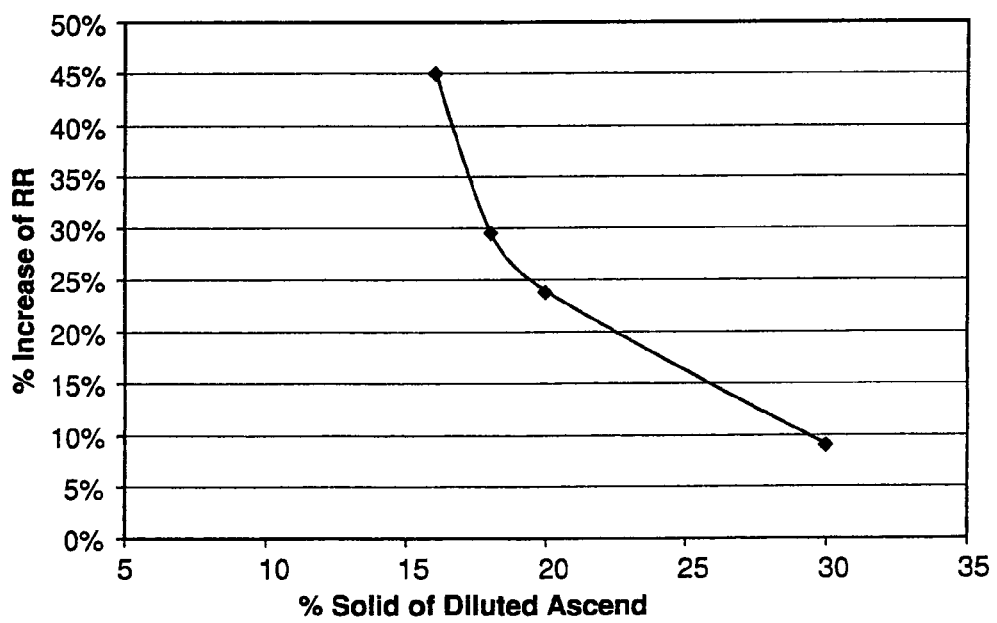
FIG. 4 is a graph showing percent increase in PETEOS removal rate during CMP as a function of percent solids of a colloidal silica.

The slurry samples in Examples 2, 4, and 6, which contained 0.6 weight percent potassium bicarbonate in silica dispersions increased removal rate dramatically. For example, addition of 0.6 weight percent potassium bicarbonate to the 20 weight percent silica dispersion increased oxide removal rate from 2829 Å/min to 3618 Å/min, a 22% increase in oxide removal rate during the polishing experiment. Interestingly, addition of 0.6 weight percent potassium bicarbonate to the 15 weight percent silica dispersion increased oxide removal rate from 1963 Å/min to 3001 Å/min, a 35% increase in oxide removal rate. In FIGS. 2 and 3, measured oxide removal rates of PETEOS wafers as a function of weight percent silica dispersion with and without potassium bicarbonate are plotted. Also, in FIG. 4, percent oxide removal rates in PETEOS wafers as function of weight percent silica dispersion are plotted. Clearly, addition of potassium bicarbonate accelerates oxide removal rate dramatically, suggesting catalysis of the cleavage of "silicon-oxygen-silicon bond" during chemical mechanical planarization of PETEOS wafers. Potassium bicarbonate is a chemical accelerator (additive) for PETEOS removal.

ishing slurry after dilution with deionized water. The colloidal silica in Example 7 is a 20 weight percent dispersion. The colloidal silica has a particle size of 50-60 nanometers. The colloidal silica was diluted with water to 20 weight percent silica dispersion without potassium bicarbonate.

Example 8-11

In Examples 8-11, commercially available colloidal silica (Ascend® OX-102, DuPont Air Products NanoMaterials L.L.C., Tempe, Ariz.) as described in above Comparative Example 7, was used for polishing experiments after dilution with deionized water and with addition of chemical accelerator (additive). All Examples 8-11 contained weight percent colloidal dispersion with varying concentrations of potassium bicarbonate. Thus, Example 8 contained 0.3 weight percent potassium bicarbonate, Example 9 contained 0.6 weight percent potassium bicarbonate, Example 10 contained 1.0 weight percent potassium bicarbonate, and Example 13 contained 2.0 weight percent potassium bicarbonate. This colloidal silica has a particle size of 50-60 nanometers. These potassium carbonate formulated Ascend® OX-102 samples were used for polishing experiments.

Discussion of Examples 7 (Comparative) and Examples 8-11

Key results for Examples 7 (comparative) and 8-11 are summarized in Table 2, which includes PETEOS removal

TABLE 1

Effect of Dilution of Colloidal Silica, Ascend ® OX-102 on the Removal Rates of PETEOS Dielectric in the Presence of Potassium Bicarbonate (KHCO3), slurry pH = 9.4

| Sample | Example 1: Ascend ® OX-102, 20 wt. % silica, No KHCO3, Control | Example 2: Ascend ® OX-102, 20 wt. % silica, 0.6% KHCO3 | Example 3: Ascend ® OX-102, 30 wt. % silica, No KHCO3, Control | Example 4: Ascend ® OX-102, 30 wt. % silica, 0.6% KHCO3 | Example 5: Ascend ® OX-102, 15 wt. % silica, No KHCO3 | Example 6: Ascend ® OX-102, 15 wt. % silica, 0.6% KHCO3 |
|---|---|---|---|---|---|---|
| PETEOS Removal rates, Å/min | 2829 | 3618 | 4342 | 4971 | 1963 | 3001 |
| PETEOS Range, Å/min | 295 | 160 | 321 | 880 | 573 | 401 |

Comparative Example 7 and Examples 8-11

These examples illustrate the effect of potassium bicarbonate concentration on the PETEOS removal rates at fixed (20 weight percent) weight percent silica dispersion, and pH of 9.4.

Example 7 (Comparative)

In the Comparative Example 7, commercially available colloidal silica (Ascend® OX-102 DuPont Air Products NanoMaterials L.L.C., Tempe, Ariz.) was used as the polrate data for PETEOS wafers CMP processed with the five slurries. As the data in this table indicate, using 20 weight percent silica in each example, as the concentration of potassium bicarbonate increased from 0.3 weight percent to 2.0 weight percent, PETEOS removal rate increased. The data also suggest that the PETEOS removal rate tends to level out between 1.0 weight percent to 2.0 weight percent potassium bicarbonate. Compared to Comparative Example 7 with no potassium bicarbonate, as the concentration of potassium bicarbonate was increased to 1.0 weight percent in Example 10, the PETEOS removal rate increased from 2829 Å/min to 3813 Å/min, an increase in oxide removal rate of 25.8%.

TABLE 2

Effect of Potassium Bicarbonate (KHCO3) Concentration on the Removal Rate of PETEOS Dielectric at the Fixed Concentration of Colloidal Silica, Ascend ® OX-102 Diluted to 20 Weight Percent Silica, slurry pH = 9.4

| Sample | Example 7: Ascend ® OX-102, 20 wt. % silica, No KHCO3, Control | Example 8: Ascend ® OX-102, 20 wt. % silica, 0.3% KHCO3 | Example 9: Ascend ® OX-102, 20 wt. % silica, 0.6% KHCO3 | Example 10: Ascend ® OX-102, 20 wt. % silica, 1.0% KHCO3 | Example 11: Ascend ® OX-102, 20 wt. % silica, 2% KHCO3 |
|---|---|---|---|---|---|
| PETEOS Removal rates, Å/min | 2829 | 3585 | 3618 | 3813 | 3854 |
| PETEOS Range, Å/min | 295 | 267 | 160 | 485 | 586 |

Examples 12-15

In Examples 12-15, commercially available colloidal silica (Ascend® OX-102, DuPont Air Products NanoMaterials L.L.C., Tempe, Ariz.) as described in above Example 9, was used for polishing experiments after dilution with deionized water. All Examples 12-15 contained 20 weight percent colloidal dispersion with fixed amount of potassium bicarbonate at 0.40 weight percent in the formulation. After preparing the colloidal silica slurry formulations, pH of Example 12 was adjusted to 9.4 with potassium hydroxide, Example 13 was adjusted to pH 10.2 with potassium hydroxide, Example 14 was adjusted to pH 10.5 with potassium hydroxide, and Example 15 was adjusted to 10.8 with potassium hydroxide.

In Table 3, removal rate data obtained for the slurries of Examples 12-15 is tabulated. Also, PETEOS removal rates of PETEOS wafers as a function of pH is shown in FIG. 1. Clearly as the pH increased from 9.4 to 10.8, the PETEOS removal rate starts to increase, reaches a plateau, followed by a drop off in PETEOS removal rate above 10.6. Thus, a change in pH from 9.45 to 10.5 resulted in increasing PETEOS removal rate from 3588 Å/min to 3808 Å/min, which percentage-wise is an increase of 5.6%.

TABLE 3

Effect of pH on the Removal Rate of PETEOS Dielectric at the Fixed Concentration of Potassium Bicarbonate (KHCO3), 0.4 Weight Percent and fixed Concentration of Colloidal Silica, Ascend ® OX-102 Diluted to 20 Weight Percent Silica.

| Sample | Example 12: Ascend ® OX-102, 20 wt. % silica, 0.4% KHCO3, pH = 9.45 | Example 13: Ascend ® OX-102, 20 wt. % silica, 0.4% KHCO3, pH = 10.2 | Example 14: Ascend ® OX-102, 20 wt. % silica, 0.4% KHCO3, pH = 10.5 | Example 15: Ascend ® OX-102, 20 wt. % silica, 0.4% KHCO3, pH = 10.8 |
|---|---|---|---|---|
| PETEOS Removal rates, Å/min | 3588 | 3774 | 3808 | 3784 |
| PETEOS Range, Å/min | 187 | 356 | 376 | 485 |

Examples 16-19

In Examples 16 (comparative) and 17-19, commercially available colloidal silica (Ascend® OX-102, DuPont Air Products NanoMaterials L.L.C., Tempe, Ariz.) was used for polishing experiments after dilution with deionized water. All Examples 16-19 contained 15 weight percent colloidal dispersion with varying concentrations of potassium bicarbonate. Thus, Example 17 contained 0.20 weight percent potassium bicarbonate, Example 18 contained 0.30 weight percent potassium bicarbonate, and Example 19 contained 1.0 weight percent potassium bicarbonate, and Example 16 was comparative without potassium bicarbonate. The colloidal silica has a particle size of 50-60 nanometers. The potassium bicarbonate-formulated Ascend® OX-102 slurries were used for polishing experiments.

In Table 4, removal rate data for Examples 16-19 is tabulated. The data in Table 4 indicates that PETEOS removal rate increased using 15 weight percent silica in each example, as the concentration of potassium bicarbonate increased form 0.2% to 1.0%,. Compared to the control experiment, Example 16 with no potassium bicarbonate, as the concentration of potassium bicarbonate from 0.2% in Example 17 to 1.0% in Example 19, the PETEOS removal rate increased from 1963 Å/min to 3005 Å/min, which percentage-wise is an increase in oxide removal rate of 34.5%.

TABLE 4

Effect of Potassium Bicarbonate (KHCO3) Concentration on the Removal Rate of PETEOS Dielectric at the Fixed Concentration of Colloidal Silica, Ascend ® OX-102 Diluted to 15% Weight Percent Silica, pH = 9.6

| Sample | Example 16: Ascend ® OX-102, 15 wt. % silica, No KHCO3, | Example 17: Ascend ® OX-102, 15 wt. % silica, 0.2% KHCO3, | Example 18: Ascend ® OX-102, 15 wt. % silica, 0.3% KHCO3, | Example 19: Ascend ® OX-102, 5 wt. % silica, 1.0% KHCO3, |
|---|---|---|---|---|
| PETEOS Removal rates, Å/min | 1963 | 2600 | 2726 | 3005 |
| PETEOS Range, Å/min | 187 | 259 | 402 | 323 |

Examples 20-22

In Examples 20-22, commercially available colloidal silica (Ascend® OX-102, DuPont Air Products NanoMaterials L.L.C., Tempe, Ariz.) was used for polishing experiments after dilution with deionized water. Examples 20-22 each contained 20 weight percent colloidal silica. Example 20 in addition contained 1.0 weight percent potassium bicarbonate, Example 21 contained in addition 1.0 weight percent potassium bicarbonate and 0.15 weight percent Xanthan gum, and Example 22 contained in addition 1.0 weight percent potassium bicarbonate and 1.0 weight percent potassium iodide. These three formulated Ascend® OX-102 slurries were used for polishing experiments.

In Table 5, removal rate data for Examples 20-22 is tabulated. The data in Table 5 indicates that PETEOS removal rate increased using 20 weight percent silica with 1.0 weight percent potassium bicarbonate, with the addition of other additives such as Xanthan gum and potassium iodide. Thus, compared to Example 20 with 1.0 weight percent potassium bicarbonate as sole additive to the colloidal silica, addition of 0.1 weight percent Xanthan gum in addition to 1.0 weight percent potassium bicarbonate in Example 21, increased the oxide removal rate from 3402 Å/min to 3692 Å/min, which percentage-wise is an increase of 7.8%. As shown in Example 22, addition of 1.0 weight percent potassium iodide in addition to 1.0 weight percent potassium bicarbonate, increased the oxide removal rate from 3402 Å/min to 3523 Å/min, which percentage-wise is an increase of 3.4%. This data indicates that Xanthan gum is approximately 2.1-fold better than potassium iodide at increasing oxide removal rate during polishing of PETEOS wafers when used as a co-additive for potassium bicarbonate in these slurries.

TABLE 5

Synergy of Addition of Potassium Bicarbonate with Other Additives such as Potassium Iodide, and Xanthan Gum for increasing the Removal Rate of PETEOS Dielectric at the Fixed Concentration of Colloidal Silica, Ascend ® OX-102 Diluted to 20 Weight Percent Silica

| Sample | Example 20: Ascend ® OX-102, 20 wt. % silica, 1.0 wt. % potassium bicarbonate, | Example 21: Ascend ® OX-102, 20 wt. % silica, 1.0 wt. % potassium bicarbonate, and 0.15 wt. % Xanthan gum | Example 22: Ascend ® OX-102. 20 wt. % silica, 1.0 wt. % potassium bicarbonate, and 1.0 wt. % potassium iodide |
|---|---|---|---|
| PETEOS Removal rates, Å/min | 3402 | 3692 | 3523 |
| PETEOS Range, Å/min | 431 | 391 | 403 |

Examples 23-28

In Examples 23-28, commercially available colloidal silica (Ascend® OX-102, DuPont Air Products NanoMaterials L.L.C., Tempe, Ariz.) was used for polishing experiments after dilution with deionized water. All Examples 23-27 contained 20 weight percent colloidal silica, and 1.0 weight percent potassium bicarbonate, this formulation was used to polish various dielectric films. In Table 6, polishing results for PETEOS (Example 23), Coral® (Example 24), Black Diamond® (Example 25), Silicon carbide (Example 26), Silicon Nitride (Example 27), and BPSG (Example 28) wafers are described. Data from Table 6 clearly suggest that all six dielectric films show an increase in removal rates for slurries containing potassium bicarbonate as a chemical accelerator (additive), despite the different chemical compositions of the dielectric films.

TABLE 6

Effect of Adding 1.0 Weight Percent Potassium Bicarbonate on the Removal Rates of Dielectric Films; Abrasive: Ascend ® OX-102 diluted to 20 Weight Percent Silica in Water as Dispersion, pH = 10.5

| Samples | Example 23: PETEOS dielectric film | Example 24: Coral ® carbon doped oxide() | Example 25: Black Diamond ® Carbon doped oxide(*) | Example 26: Silicon carbide | Example 27: Silicon nitride | Example 28: BPSG |
|---|---|---|---|---|---|---|
| Removal rates of dielectric films: control experiments: No potassium bicarbonate added | 2796 Å/min | 216 Å/min | 50 Å/min | 414 Å/min | 16 Å/min | 3590 Å/min |
| Removal rates of dielectric films: 1.0% Potassium | 3698 Å/min | 616 Å/min | 68 Å/min | 1156 Å/min | 91 Å/min | 4737 Å/min |

TABLE 6-continued

Effect of Adding 1.0 Weight Percent Potassium Bicarbonate on the Removal
Rates of Dielectric Films; Abrasive: Ascend ® OX-102 diluted to 20 Weight Percent Silica
in Water as Dispersion, pH = 10.5

| Samples | Example 23: PETEOS dielectric film | Example 24: Coral ® carbon doped oxide() | Example 25: Black Diamond ® Carbon doped oxide(*) | Example 26: Silicon carbide | Example 27: Silicon nitride | Example 28: BPSG |
|---|---|---|---|---|---|---|
| bicarbonate added | | | | | | |

*Boron-phosphorous doped silicon oxide
**Coral ® Novellus system plasma enhanced chemical vapor deposition (PECVD) carbon doped oxide as dielectric film
***Black Diamond ® Applied Materials carbon doped oxide dielectric film The present invention has been set forth with regard to one or more preferred embodiments, but the full scope of the present invention should be ascertained from the claims which follow.

What is claimed is:

1. A composition for dielectric polishing consisting essentially of:
   a) an abrasive, wherein the abrasive is colloidal silica and the colloidal silica comprises a hydroxide base and has a pH of at least 9.6;
   b) at least 0.2% by weight of a bicarbonate salt;
   c) a viscosity modifier which is a gum; and
   d) water, wherein the composition provides a silicon oxide removal rate of between 3200 Å/min to 4200 Å/min, and wherein the composition exhibits a higher dielectric removal rate than a second composition, said second composition being identical to the composition except that the bicarbonate salt is absent.

2. The composition of claim 1 wherein the bicarbonate salt is present at a level of at least 0.3 weight percent.

3. The composition of claim 1 wherein the hydroxide base is selected from the group consisting of potassium hydroxide and ammonium hydroxide.

4. The composition of claim 1 wherein the gum is xanthan gum.

5. The composition of claim 1 wherein the abrasive is present at a level of less than or equal to 20 weight percent.

6. The composition of claim 1 wherein the viscosity modifier is present at a level between 0.1 and 3 weight percent.

7. The composition of claim 1 wherein the bicarbonate salt is present at a level of at least 0.5 weight percent.

8. The composition of claim 1 wherein the bicarbonate salt is present at a level of at least 0.6 weight percent.

9. The composition of claim 1 wherein the bicarbonate salt is present at a level between 0.6 and 2 weight percent.

10. The composition of claim 1 wherein the colloidal silica is present at a level between 15 and 30 weight percent.

11. The composition of claim 1 wherein the bicarbonate salt is present at a level of at least 0.4% weight percent.

12. The composition of claim 1 wherein the bicarbonate salt is selected from the group consisting of potassium bicarbonate and ammonium bicarbonate.

13. The composition of claim 12 wherein the bicarbonate salt is potassium bicarbonate.

14. A method of polishing a substrate comprising a dielectric with high removal rate of the dielectric, said method comprising the steps of:
   A) placing the substrate comprising the dielectric in contact with a polishing pad;
   B) delivering a low solids-content composition consisting essentially of:
      a) an abrasive, wherein the abrasive is colloidal silica and the colloidal silica comprises a hydroxide base and has a pH of at least 9.6;
      b) at least 0.2% by weight of a bicarbonate salt;
      c) a viscosity modifier which is a gum; and
      d) water, wherein the composition exhibits a higher removal rate than a second composition, said second composition being identical to the low solids-content composition except that the bicarbonate salt is absent; and
   C) polishing the substrate with the composition.

15. The method of claim 14 wherein the hydroxide base is selected from the group consisting of potassium hydroxide and ammonium hydroxide.

16. The method of claim 14 wherein the gum is xanthan gum.

17. The method of claim 14 wherein the abrasive is present in the composition at a level of less than or equal to 20 weight percent.

18. The method of claim 14 wherein the dielectric is an oxide.

19. The method of claim 14 wherein the dielectric is a low-k material.

20. The method of claim 19 wherein the low-k material is selected from the group consisting of organic polymers, carbon-doped oxides, fluorinated silicon glass, inorganic porous oxide-like materials, and hybrid organic-inorganic materials.

21. The method of claim 14 wherein the bicarbonate salt in the composition is present at a level of at least 0.3 weight percent.

22. The method of claim 21 wherein the bicarbonate salt is selected from the group consisting of potassium bicarbonate and ammonium bicarbonate.

23. The method of claim 22 wherein the bicarbonate salt is potassium bicarbonate.

* * * * *